(12) United States Patent
Wuu et al.

(10) Patent No.: US 9,391,235 B2
(45) Date of Patent: Jul. 12, 2016

(54) PATTERNED SUBSTRATE FOR EPITAXIALLY GROWING SEMICONDUCTOR MATERIAL, AND METHOD FOR PATTERNING A SUBSTRATE

(75) Inventors: Dong-Sing Wuu, Taichung (TW); Ray-Hua Horng, Taichung (TW); Wei-Ting Lin, Taichung (TW)

(73) Assignee: NATIONAL CHUNG-HSING UNIVERSITY, Taichung (TW)

( * ) Notice: Subject to any disclaimer, the term of this patent is extended or adjusted under 35 U.S.C. 154(b) by 1050 days.

(21) Appl. No.: 13/299,784

(22) Filed: Nov. 18, 2011

(65) Prior Publication Data

US 2012/0128939 A1    May 24, 2012

(30) Foreign Application Priority Data

Nov. 22, 2010  (TW) ................................ 99140171 A

(51) Int. Cl.
| | |
|---|---|
| B32B 3/30 | (2006.01) |
| H01L 33/20 | (2010.01) |
| C30B 25/18 | (2006.01) |
| C30B 29/40 | (2006.01) |
| C30B 25/04 | (2006.01) |
| C30B 29/60 | (2006.01) |

(52) U.S. Cl.
CPC ................ H01L 33/20 (2013.01); C30B 25/18 (2013.01); C30B 29/406 (2013.01); C30B 25/04 (2013.01); C30B 29/60 (2013.01); *Y10T 428/24479* (2015.01)

(58) Field of Classification Search
CPC . Y10T 428/24479; H01L 33/22; C30B 25/18; C30B 29/60; C30B 25/04
See application file for complete search history.

(56) References Cited

U.S. PATENT DOCUMENTS

| | | | |
|---|---|---|---|
| 6,852,203 B1* | 2/2005 | Kawakami et al. ........ 204/192.3 |
| 7,968,361 B2* | 6/2011 | Osawa .................... H01L 33/22 |
| | | | 257/14 |
| 2003/0030068 A1* | 2/2003 | Hata et al. ...................... 257/103 |
| 2008/0303042 A1* | 12/2008 | Minato et al. ................... 257/98 |
| 2009/0114933 A1* | 5/2009 | Osawa .................... H01L 33/22 |
| | | | 257/96 |
| 2009/0267105 A1* | 10/2009 | Yu ........................ H01L 33/382 |
| | | | 257/99 |

FOREIGN PATENT DOCUMENTS

| | | |
|---|---|---|
| KR | 20100118086 | 11/2010 |
| TW | 201038780 A1 | 11/2011 |

OTHER PUBLICATIONS

English translation of Grounds for Rejection issued in Korean Application KR20120055467.
Search Report of Chinese Patent Application No. 201110378822X issued on May 9, 2013 with English Translation.

* cited by examiner

*Primary Examiner* — Donald J Loney
(74) *Attorney, Agent, or Firm* — Duane Morris LLP

(57) ABSTRACT

A patterned substrate for epitaxially growing a semiconductor material includes: a top surface; and a plurality of spaced apart recesses, each of which is indented downwardly from the top surface and is defined by n crystal planes, n being an integer not less than 3. Each of the crystal planes has an upper edge meeting the top surface and is adapted for epitaxially growing the semiconductor material. A maximum distance from one of the upper edges of one of the recesses to an adjacent one of the upper edges of an adjacent one of the recesses is not greater than 500 nm.

4 Claims, 12 Drawing Sheets

PATENTED SUBSTRATE FOR EPITAXIALLY GROWING SEMICONDUCTOR MATERIAL, AND METHOD FOR PATTERNING A SUBSTRATE

CROSS-REFERENCE TO RELATED APPLICATION

This application claims priority of Taiwanese Application No. 099140171, filed on Nov. 22, 2010.

BACKGROUND OF THE INVENTION

1. Field of the Invention

The present invention relates to a substrate and the method of producing the same and, more particularly to a patterned substrate for epitaxially growing a semiconductor material and a method for patterning a substrate.

2. Description of the Related Art

A conventional substrate for epitaxially growing a semiconductor material is obtained by cutting slices from a single-crystal ingot, and then polishing and chemical washing the cut slices. The substrate thus obtained has unavoidably a residual stress, or defects. Therefore, when an epitaxial layered structure is epitaxially grown on such substrate, the defects of the substrate will propagate to the epitaxial layered structure and affect adversely the quality of the epitaxial layered structure, thereby degrading the working performance of the semiconductor device produced therefrom.

Referring to FIG. 1, to solve the abovementioned problem, it is common to pattern an upper face 11 of the conventional substrate 1 for epitaxially growing a semiconductor material so that the conventional substrate 1 is further formed with a plurality of downwardly indented recesses 12 from the upper face 11 after being cut and polished. The recesses 12 thus formed are spaced apart from one another and arranged periodically. When the epitaxial layered structure is formed on the upper face 11 of the conventional substrate 1, the area of the upper face 11 where nucleation, grain growth and coalescene tend to occur is reduced due to the existence of the recesses 12. Thus, the opportunities of propagation of the defects from the substrate 1 to the epitaxial layered structure are lowered so as to obtain an epitaxial layered structure with an improved epitaxial quality.

However, since there is still some occurrence of nucleation, grain growth and coalescene on the upper face 11 of the conventional substrate 1, the propagation of the defects to the epitaxial layered structure is unavoidable, and the conventional substrate 1 is required to be further improved so as to enhance the crystal quality of the epitaxial layered structure formed thereon.

SUMMARY OF THE INVENTION

Therefore, the object of the present invention is to provide a patterned substrate for epitaxially growing a semiconductor material and a method for patterning a substrate that can alleviate the aforesaid drawbacks of the prior art.

According to one aspect of this invention, a patterned substrate for epitaxially growing a semiconductor material includes: a top surface; and a plurality of spaced apart recesses, each of which is indented downwardly from the top surface and is defined by n crystal planes, n being an integer not less than 3, each of the crystal planes having an upper edge meeting the top surface and being adapted for epitaxially growing the semiconductor material; wherein a maximum distance from one of the upper edges of one of the recesses to an adjacent one of the upper edges of an adjacent, one of the recesses is not greater than 500 nm.

According to another aspect of this invention, a method for patterning a substrate that is adapted for epitaxially growing a semiconductor material includes: (a) forming a covering layer over a substrate that is a single crystal structure, the covering layer being formed with a plurality of through holes to partially expose the substrate; (b) wet-etching the covering layer and the substrate to form a plurality of cavities each of which is indented from an upper face of the substrate and has at least three inclined faces that extend from the upper face, the covering layer having an etching rate lower than that of the substrate; (c) removing the covering layer; and (d) wet-etching the upper face and the inclined faces of the cavities of the substrate so as to form the cavities into a plurality of recesses to obtain a patterned substrate, each of the recesses being defined by n crystal planes, n being an integer not less than 3.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 2:
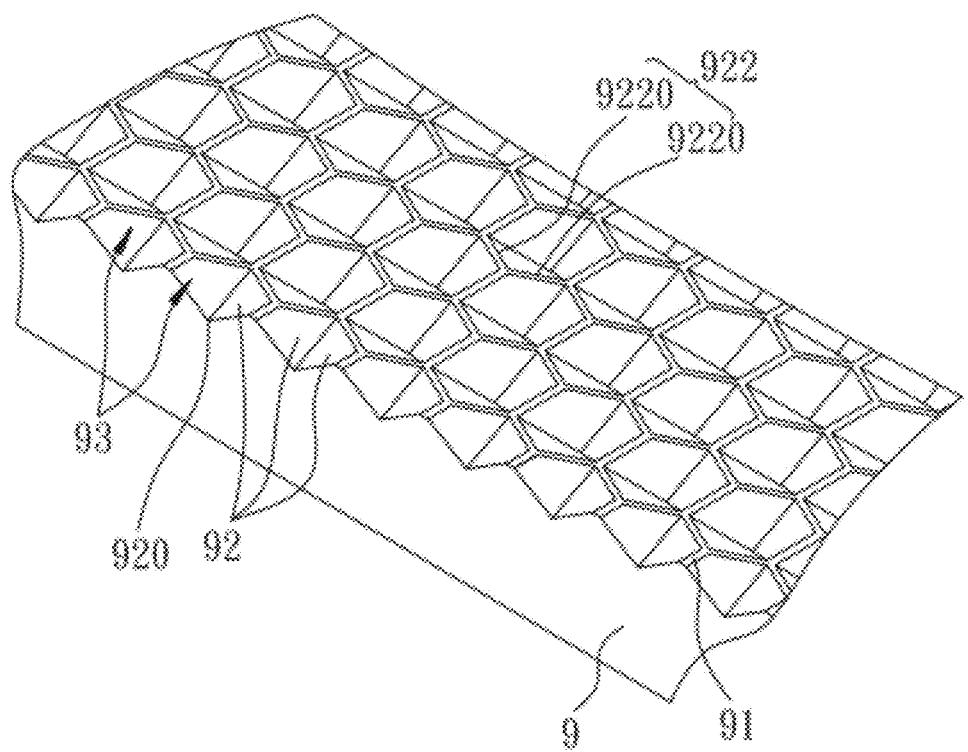
FIG. 2 is a fragmentary perspective view of the preferred embodiment of a patterned substrate for epitaxially growing a semiconductor material according to the present invention.
Figure 3:
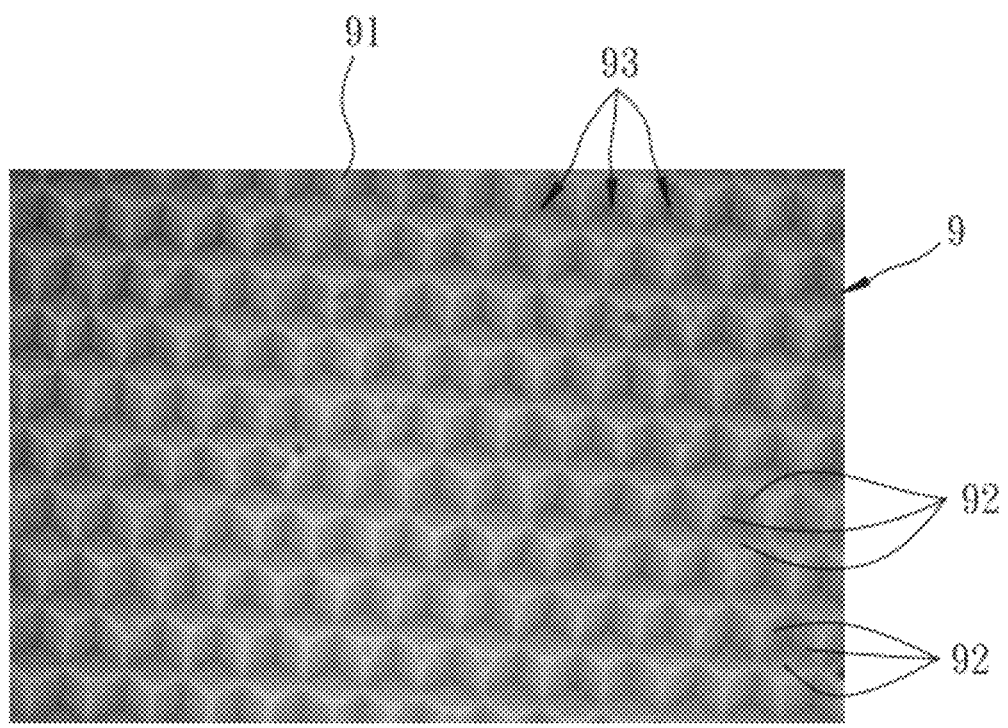
FIG. 3 is a scanning electron microscope photograph of the preferred embodiment of the substrate for epitaxially growing a semiconductor material.

Referring to FIGS. 2 and 3, the preferred embodiment of a substrate 9 of the present invention is adapted for epitaxially growing a semiconductor material. The substrate 9 is a sapphire substrate and comprises a top surface 91, and a plurality of spaced apart recesses 93. Each of the recesses 93 is indented downwardly from the top surface 91 and is defined by n crystal planes 92, n being an integer not less than 3. Each of the crystal planes 92 has an upper edge 922 meeting the top surface 91 and being adapted for epitaxially growing the semiconductor material. A maximum distance from one of the upper edges 922 of one of the recesses 93 to an adjacent one of the upper edges 922 of an adjacent one of the recesses 93 is not greater than 500 nm, wherein, among the upper edges 922 of the adjacent one of the recesses 93, the adjacent one of the upper edges 922 of the adjacent one of the recesses 93 being closest to the one of the upper edges 922 of the one of the recesses 93.

More specifically, in this embodiment, the substrate 9 has a hexagonal crystal system and n is an integer of 3 so that each of the recesses 93 is composed of three crystal planes 92. Each of the recesses 93 has a bottom end 920, and has a depth from the bottom end 920 to the top surface 91 ranging from 0.3 μm to 3 μm. The top surface 91 is a crystal face (0001). Each of the crystal planes 92 is one of the group of crystal planes $\{11\bar{2}k\}$. The top surface 91 and each of the crystal planes 92 form an angle ranging from 119° to 156°. The group of the crystal planes $\{11\bar{2}k\}$ are $(11\bar{2}k)$, $(1\bar{2}1k)$, $(\bar{2}11k)$, $(2\bar{1}\bar{1}k)$, $(\bar{1}\bar{1}2k)$, and $(\bar{1}2\bar{1}k)$, where $\bar{k}$ is an integer ranging from 2 to 5. Each of the upper edges 922 is composed of two sides 9220 that are substantially identical and form an angle of 120°. Each of the two sides 9220 has a length ranging from 1 μm to 5 μm.

With the abovementioned structure, when the substrate 9 is used for epitaxially growing a semiconductor material, the surface area of the top surface 91 available for nucleation is substantially zero. The grain growth and the coalescence after the nucleation are carried on from the three crystal planes 92, thereby lowering the opportunities of propagation of the defects into the epitaxial layered structure growing on the substrate 9 and obtaining an epitaxial layered structure having an improved epitaxial quality. Therefore, the working performance of the semiconductor device produced from the substrate 9 can be enhanced.

Figure 4:
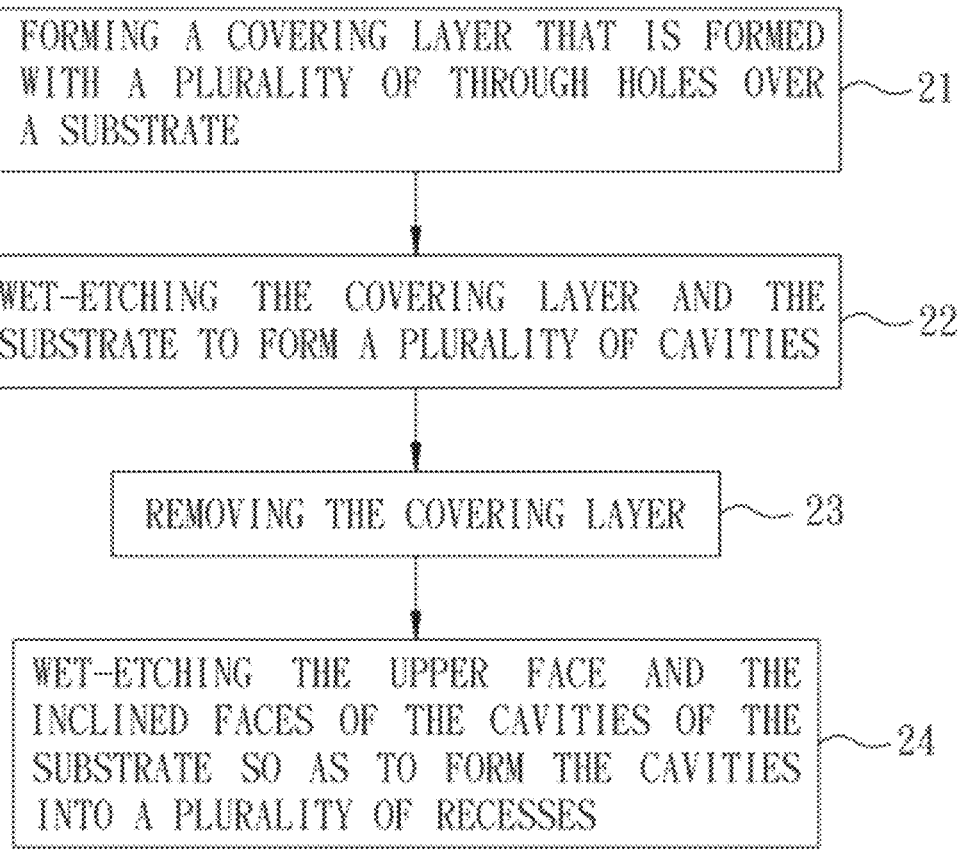
FIG. 4 is a flow chart of the preferred embodiment of a method for patterning a substrate for epitaxially growing a semiconductor material according to the present invention.

Referring FIG. 4, a method of patterning the substrate 9 that is adapted for epitaxially growing a semiconductor material according to the present invention includes in sequence the following four steps 21 to 24.

Figure 5:
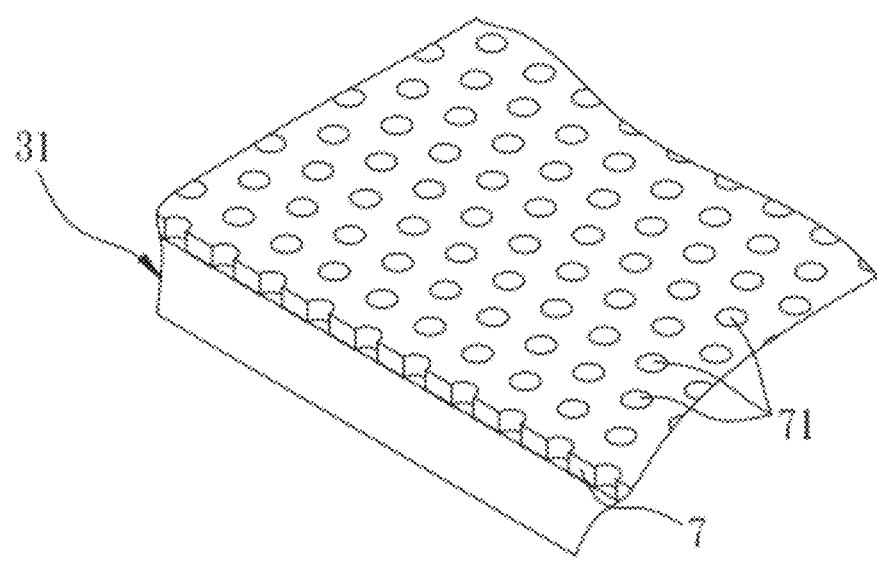
FIG. 5 is a fragmentary perspective view illustrating the step of forming a covering layer on the substrate of the preferred embodiment of the method of this invention illustrated in FIG. 4.

In detail, referring to FIGS. 4 and 5, in step 21, a covering layer 7 is formed over a substrate 31 that is a single crystal structure and that is obtained by cutting slices from a single-crystal ingot, and then polishing and chemical washing the cut slices. The covering layer 7 is formed with a plurality of through holes 71 to partially expose the substrate 31.

More specifically, in step 21, a silicon dioxide ($SiO_2$) layer is formed on a substrate 31 that has been treated with a standard cleaning procedure to remove a contamination layer on the surface of the substrate 31. Then the $SiO_2$ layer is patterned to form a plurality of through holes 71 using yellow light photolithography techniques so as to form the covering layer 7. Each of the through holes 71 has a polygonal cross section with a maximum width ranging from 1 μm to 5 μm. Preferably, a distance between central axes of two adjacent ones of the through holes 71 of the covering layer 7 ranges from 1 μm to 5 μm.

Figure 6:
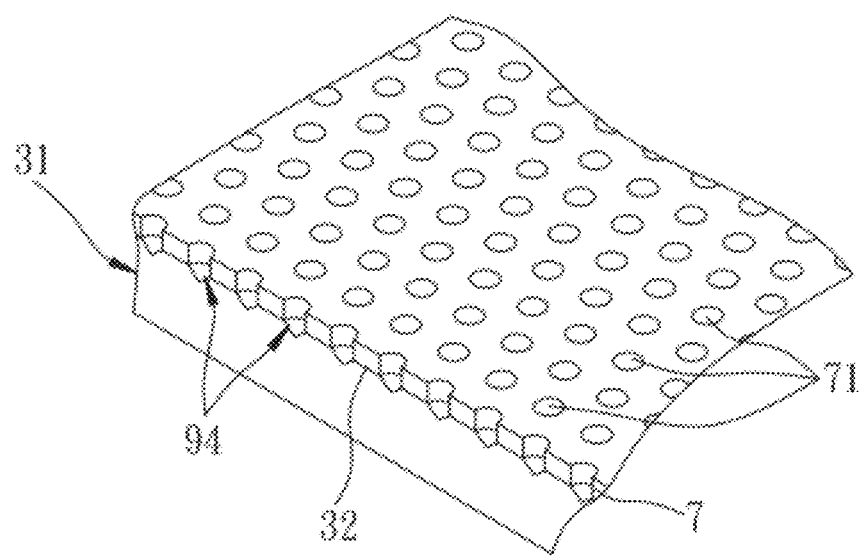
FIGS. 6 and 7 are fragmentary perspective views illustrating the step of wet-etching the covering layer and the substrate of the preferred embodiment of the method of this invention illustrated in FIG. 4.
Figure 7:
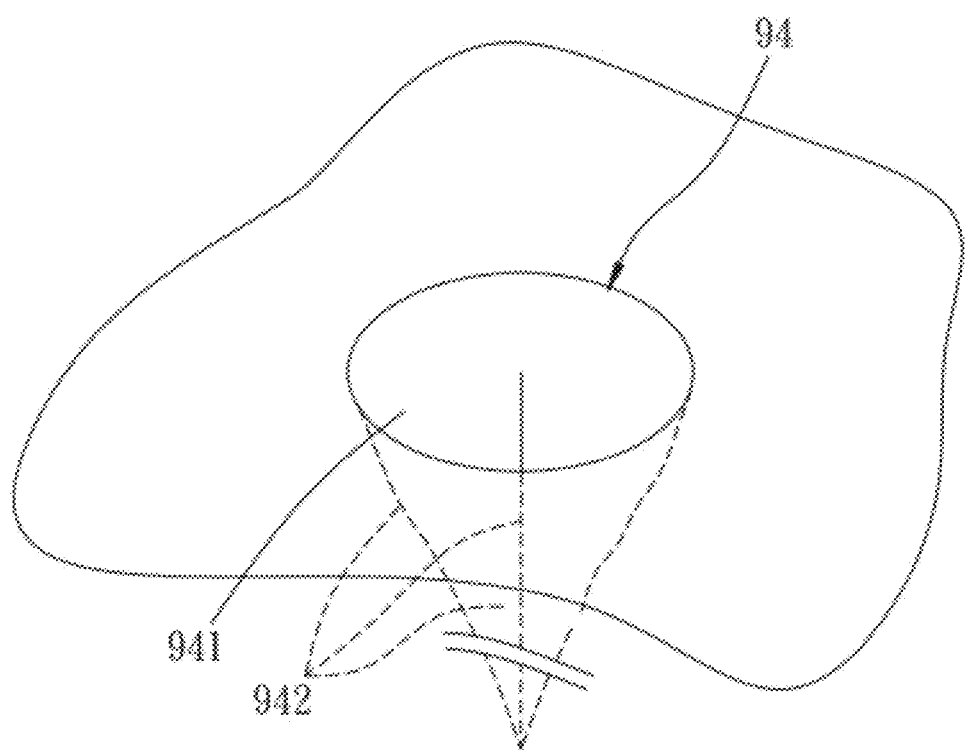

Referring to FIGS. 4 and 6 in combination with FIG. 7, in step 22, the covering layer 7 and the substrate 31 are wet-etched to form a plurality of cavities 94 each of which is indented from an upper face 32 of the substrate 31 and has at least three inclined faces 942 that extend from the upper face 32. The covering layer 7 serves as a mask and has an etching rate lower than that of the substrate 31. The substrate 31 has a hexagonal crystal system, and the upper surface 32 has a crystal face (0001).

More specifically, in step 22, the substrate 31 is etched using an etchant formed by mixing 100 ml of 98 vol % sulfuric acid and 50 ml of 85 vol % phosphorus acid at 260° C. for 10 to 20 minutes. The junction surface 941 between the covering layer 7 and the substrate 31 at the bottom of each of the through holes 71 is etched laterally and downwardly to form three inclined faces 942 that are parallel to the crystal face of the crystal structure, as shown in FIG. 7. The depth of each of the cavities 94 ranges from 0.3 μm to 3 μm relative to the upper face 32 of the substrate 31 after the etching process is completed.

Figure 8:
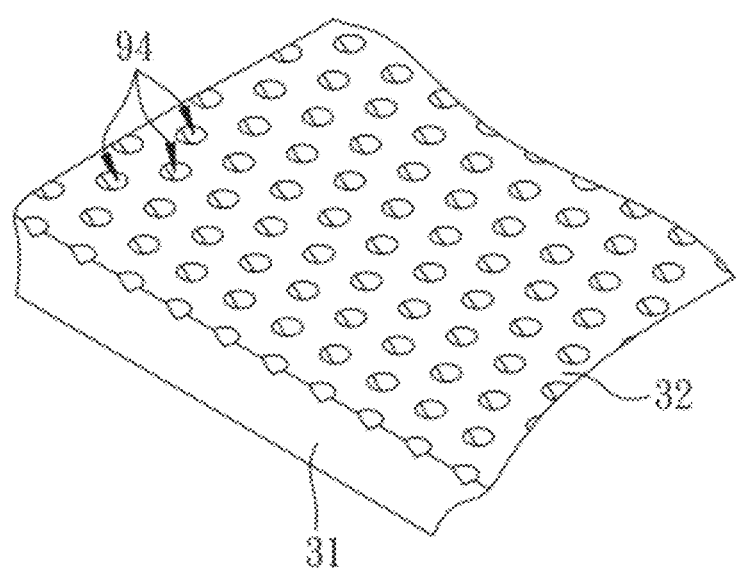
FIG. 8 is a fragmentary perspective view illustrating the step of removing the covering layer of the preferred embodiment of the method of this invention illustrated in FIG. 4.

Referring to FIGS. 4 and 8, in step 23, the covering layer 7 is removed by hydrofluoric (HF) acid to expose the upper face 32 of the substrate 31.

Figure 9:
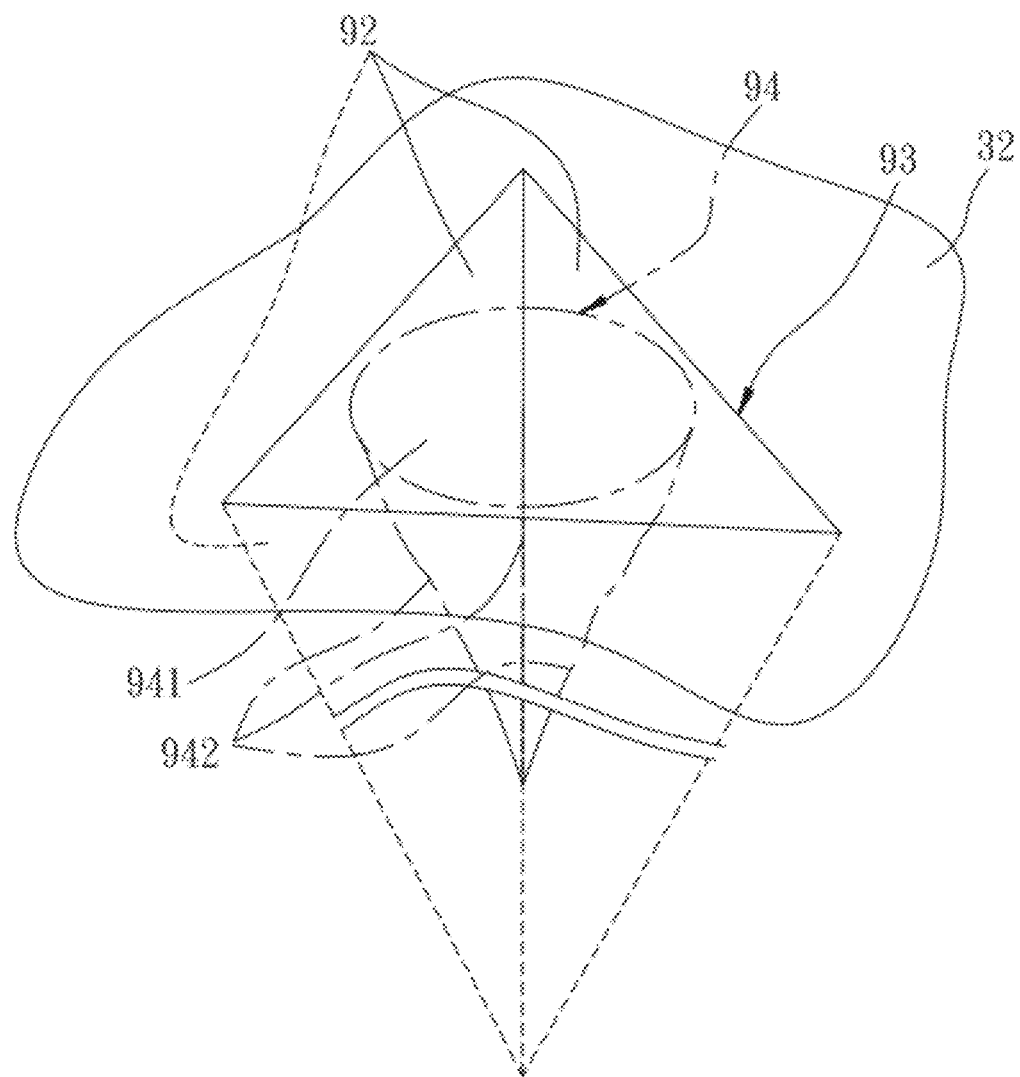
FIG. 9 is a fragmentary perspective view illustrating the step of wet-etching the upper face and the cavities of the substrate of the preferred embodiment of the method of this invention illustrated in FIG. 4.

Referring to FIGS. 4 and 9, in step 24, the upper face 32 and the inclined faces 942 of the cavities 94 of the substrate 31 are wet-etched so as to form the cavities 94 into a plurality of recesses 93 to obtain a patterned substrate 9 having a top surface 91. Each of the recesses 93 is defined by n crystal planes 92, and n is an integer not less than 3. In this embodiment, n is 3. Each of the crystal planes 92 has an upper edge 922 meeting the top surface 91 of the patterned substrate 9.

More specifically, in step 24, the substrate 31 is again etched using an etchant formed by mixing 100 ml of 98 vol % sulfuric acid and 50 ml of 85 vol % phosphorus acid at 260° C. for 10 to 20 minutes. The etchant flows downwardly from the top surface 91 of the patterned substrate 9 along the junction surface 941 and the three inclined faces 942 of each of the cavities 94 to form the three crystal planes 92 that extend in a direction parallel to the inclined faces 942 that have been etched, thereby forming the recess 93 each of which has an opening that is equilateral triangular in shape, as shown in FIG. 9. Next, the opening of each of the recesses 93 is continuously etched and enlarged to form a hexagonal opening, thereby obtaining the patterned substrate 9 as shown in FIG. 2. In addition, the wet-etching process is conducted until a maximum distance from one of the upper edges 922 of one of the recesses 93 to an adjacent one of the upper edges 922 of an adjacent one of the recesses 93 is not greater than 500 nm.

Figure 1:
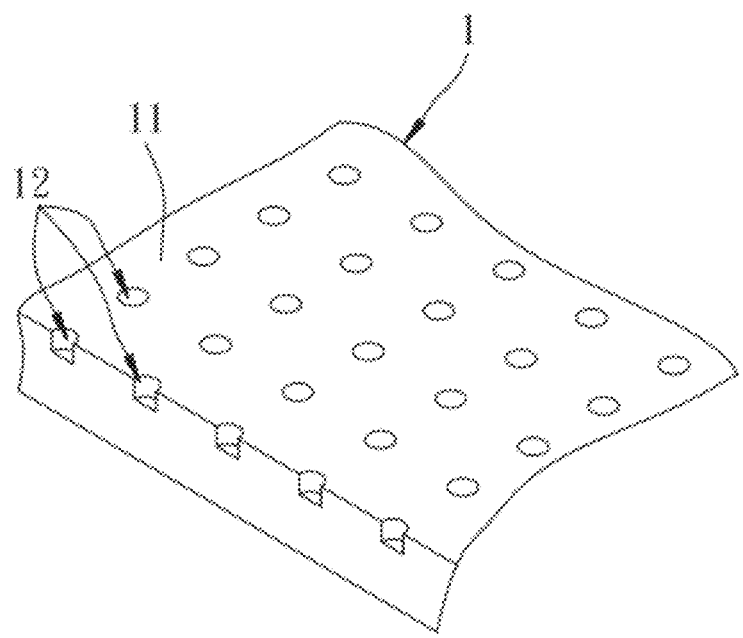
FIG. 1 is a fragmentary perspective view of a conventional substrate for epitaxially growing a semiconductor material.
Figure 10:
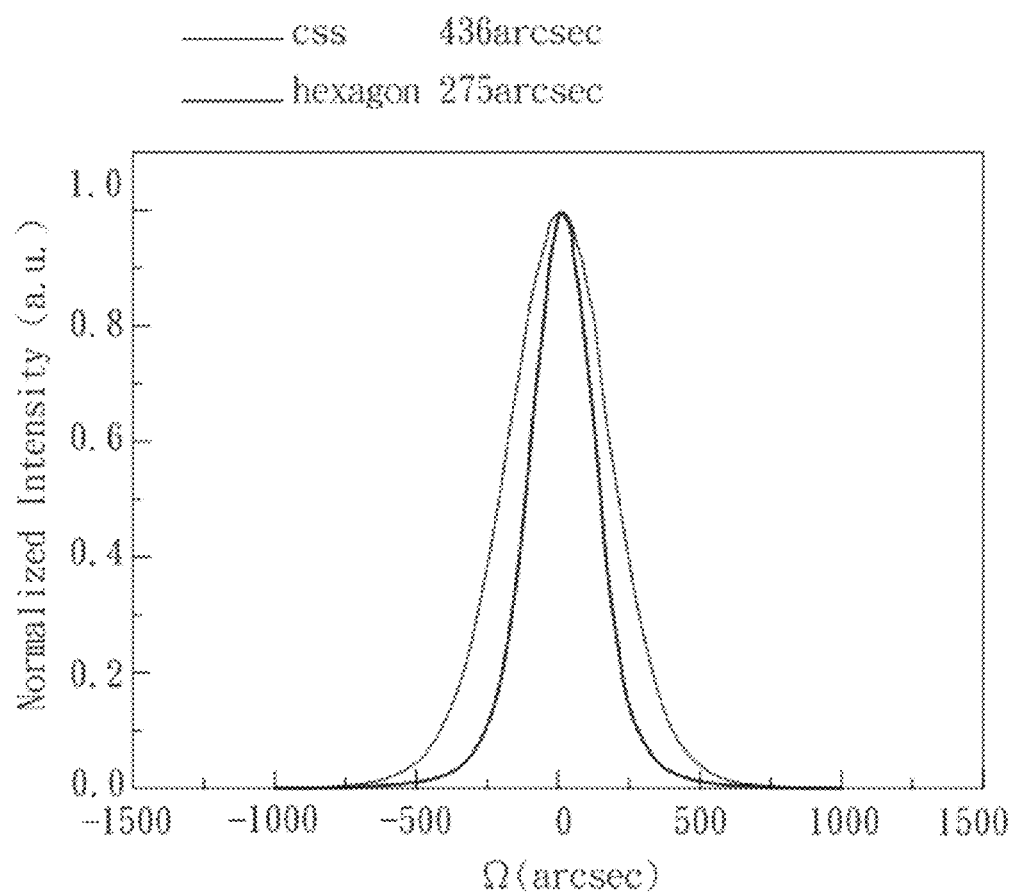
FIG. 10 is an X-ray diffraction graph, illustrating detected quality data for the preferred embodiment of the substrate for epitaxially growing a semiconductor material according to the present invention using X-ray diffraction techniques.

For making a quality comparison of the conventional substrate and the substrate 9 of this invention, GaN epitaxial layered structures were epitaxially grown respectively on the conventional substrate 1 as illustrated in FIG. 1 and the patterned substrate 9 of the present invention under the same epitaxial conditions and were inspected using X-ray diffraction techniques. The results are shown in FIG. 10. It can be seen that the epitaxial layered structure formed with the patterned substrate 9 of this invention has an asymmetrical full width at half maximum of 274 arcsec that is far smaller than that of the epitaxial layered structure formed with the conventional substrate 1, i.e., 436 arcsec. This proves that the GaN epitaxial layered structure formed with the patterned substrate 9 of this invention has less defects and better crystal quality as compared to the GaN epitaxial layered structure formed with the conventional substrate 1.

Figure 11:
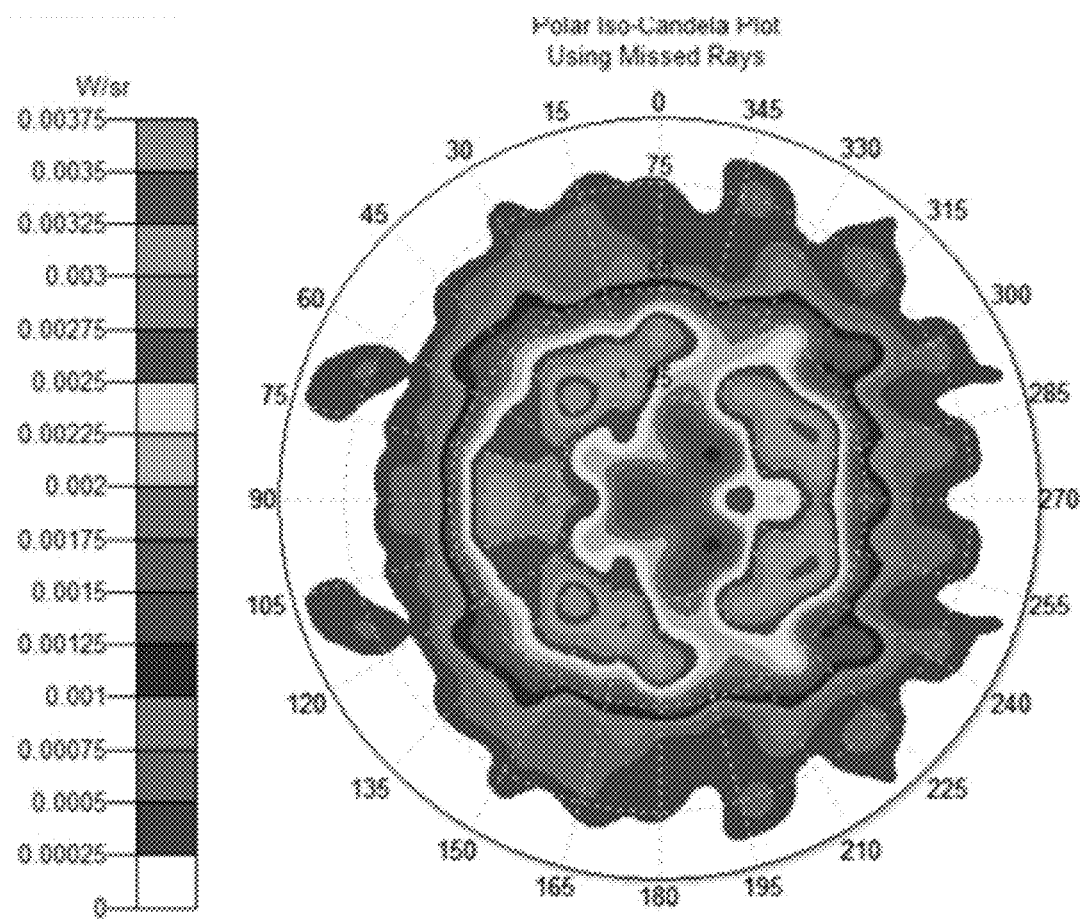
FIG. 11 is a candela plot to illustrate the candela profile of the solid-state lighting device produced with the conventional substrate for epitaxially growing a semiconductor material.
Figure 12:
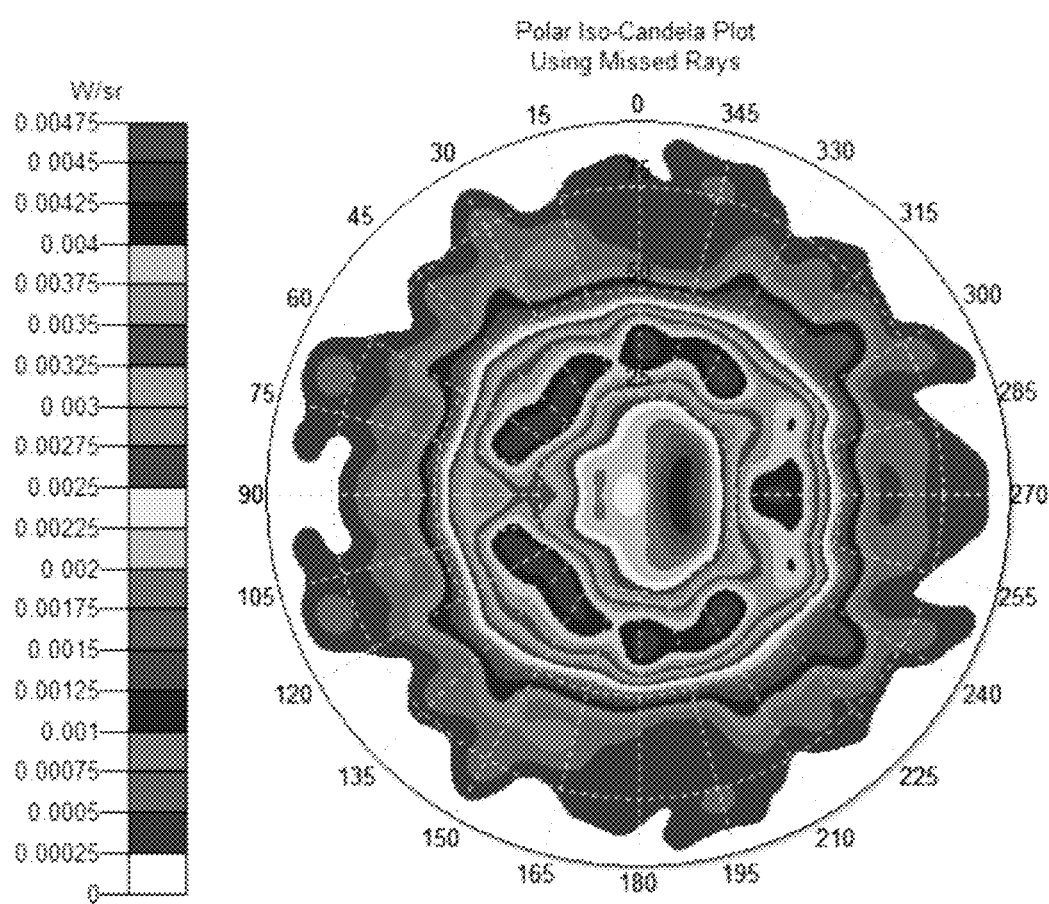
FIG. 12 is a candela plot to illustrate the candela profile of the solid-state lighting device produced with the preferred embodiment of the substrate for epitaxially growing a semiconductor material according to the present invention.

FIGS. 11 and 12 show the candela plots of the solid-state lighting devices produced respectively with the conventional substrate 1 and the patterned substrate 9 of this invention, which were obtained by means of Trace-Pro optical simulation software. It can be seen from FIGS. 11 and 12 that the maximum candela of the solid-state lighting device produced with the patterned substrate 9 of this invention is 4.75 miliwatts per steradian (i.e., 4.75 mW/sr) that is larger than that of the solid-state lighting device produced with the conventional substrate 1, i.e., 3.75 miliwatts per steradian. This means that the working performance of the solid-state lighting device produced with the patterned substrate 9 of this invention is superior to the solid-state lighting device produced with the conventional substrate 1.

It is noted that, in addition to the solid-state lighting device, the patterned substrate 9 of the present invention can be applied to produce solar cells, high electron mobility transistors, etc. In addition, although the substrate of the preferred embodiment of the present invention is described as a sapphire substrate, substrates having other crystal structures may be used to obtain the same effects as those of the substrate of the preferred embodiment of the present invention simply by calculating and controlling arrangement of positions and configurations of the cavities 71 of the covering layer 7, and modifying the conditions for performing the first and second wet-etching processes.

To sum up, compared to the conventional substrate 1, the surface area for nucleation of the top surface 91 of the patterned substrate 9 of the present invention is substantially zero. When the patterned substrate 9 of this invention is used to epitaxially grow an epitaxial layered structure, nucleation and grain growth of the epitaxial layered structure is carried out on the crystal planes 92, and thus, the defects will not propagate from the top surface 91 of the substrate 91 to the epitaxial layered structure. Therefore, the defects of the epitaxial layered structure are reduced, and the crystal quality is improved. From the candela profiles of FIGS. 11 and 12, it is confirmed that the working performance of the sol id-state lighting device produced with the patterned substrate 9 of this invention is enhanced. In addition, the object of the present invention can be achieved by first and second wet-etching processes in which the formation positions of the cavities 94 formed by the first wet-etching process are controlled precisely by the through holes 71 of the covering layer 7, and the etching time of the second wet-etching process is controlled to etch the cavities 94 into the recesses 93 defined by the crystal planes 92, thereby forming the patterned substrate 9 of the present invention.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A patterned substrate for epitaxially growing a semiconductor material directly thereon, comprising:
   a top surface having a surface area; and
   a plurality of spaced apart recesses, each of which is indented downwardly from said top surface and is defined by three or more crystal planes, each of said crystal planes having an upper edge meeting said top surface and being adapted for epitaxially growing the semiconductor material;
   wherein a maximum distance from one of said upper edges of said planes of one of said recesses to an adjacent one of said upper edges of said planes of an adjacent one of said recesses is not greater than 500 nm, thereby minimizing the surface area of the top surface available for nucleation of the semiconductor material during the epitaxial growth;
   wherein said top surface is a crystal face (0001), each of said crystal planes being one of the group of crystal planes $\{11\overline{2}k\}$, said top surface and each of said crystal planes forming an angle ranging from 119° to 156°; and
   thereby grain growth and coalescence of the semiconductor material after nucleation during the epitaxial growth of the semiconductor material are carried on from said crystal planes.

2. The patterned substrate of claim 1, wherein said patterned substrate has a hexagonal crystal system, n being 3.

3. The patterned substrate of claim 2, wherein each of said recesses has a bottom end, and has a depth from said bottom end to said top surface ranging from 0.3 μm to 3 μm.

4. The patterned substrate of claim 1, wherein each of said upper edges of said crystal planes of said recesses is composed of two sides that are substantially identical and form an angle of 120°, each of said two sides having a length ranging from 1 μm to 5 μm.

* * * * *